United States Patent [19]

Beihoff et al.

[11] Patent Number: 4,791,361

[45] Date of Patent: Dec. 13, 1988

[54] CURRENT SENSOR FOR UNIVERSAL APPLICATION

[75] Inventors: Bruce C. Beihoff, Glendale; Jerome K. Hastings, Sussex; Mark A. Juds, New Berlin; Michael S. Baran, Wauwatosa, all of Wis.

[73] Assignee: Eaton Corporation, Cleveland, Ohio

[21] Appl. No.: 61,355

[22] Filed: Jun. 11, 1987

[51] Int. Cl.[4] .............................................. G01R 1/04
[52] U.S. Cl. .................. 324/126; 324/117 R; 324/117 H
[58] Field of Search ............... 324/127, 117 H, 117 R, 324/251, 252, 126; 336/175; 338/32 R, 32 H

[56] References Cited

U.S. PATENT DOCUMENTS

| | | | |
|---|---|---|---|
| 3,405,355 | 10/1968 | Hebbert | 324/252 |
| 3,693,085 | 9/1972 | Beard | 324/252 X |
| 4,414,543 | 11/1983 | Schweitzer, Jr. | 324/127 X |

Primary Examiner—Jerry Smith
Assistant Examiner—Stephen M. Baker
Attorney, Agent, or Firm—L. G. Vande Zande

[57] ABSTRACT

A magnetic flux concentrator comprising spaced pole pieces (4,6) and magnetic shunt (8) bridging the pole pieces within an insulating housing (2) which also contains a magnetoresistive transducer (24) and electronic circuitry (26) for sensing magnetic field intensity between the pole pieces and relating that intensity as electric signals provided at wiring terminals (28) at the exterior of the housing. The pole pieces have magnetic terminal portions adjacent openings in the housing for removable attachment thereto of selected ferrous strap configurations (42,50,52,60) determined by the cross-sectional shape of the electrical conductor (46) in which current flow is to be measured, the respective strap configuration and flux concentrator forming a magnetic loop around the conductor for picking up the magnetic flux induced by current flow in the conductor.

23 Claims, 4 Drawing Sheets

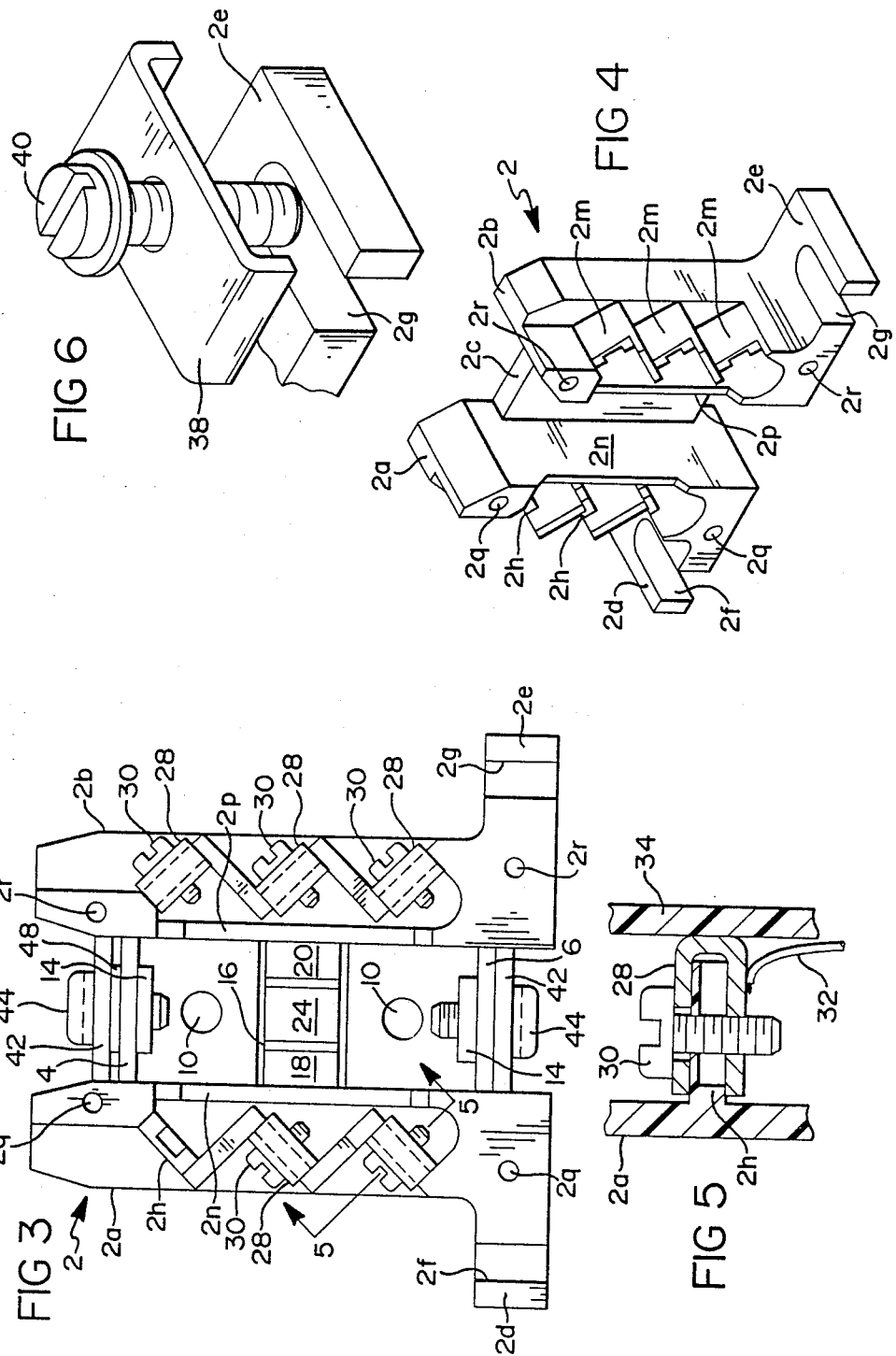

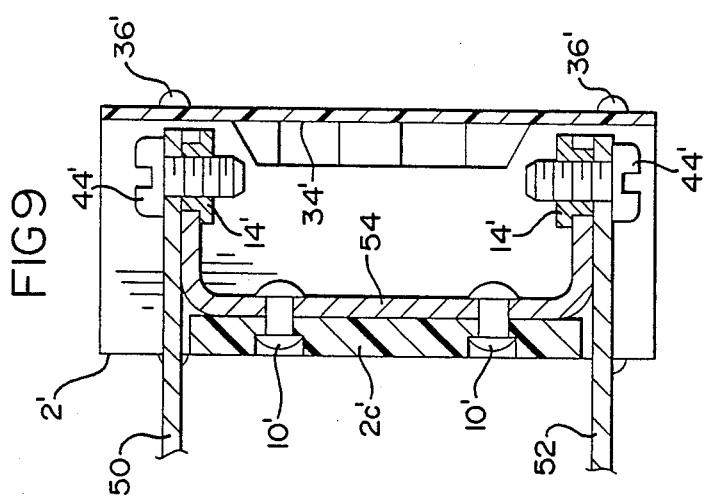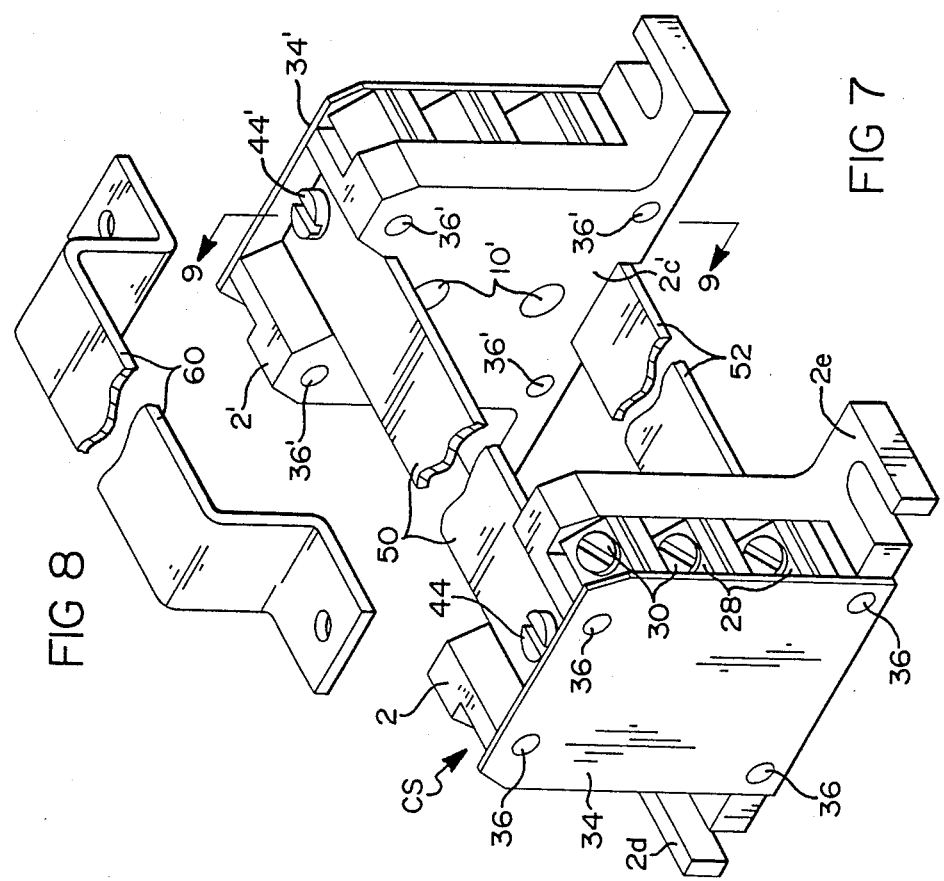

CURRENT SENSOR FOR UNIVERSAL APPLICATION

CROSS REFERENCE TO RELATED APPLICATION

This application is related to copending application Ser. No. 61,351 entitled MRS Current Sensor filed concurrently herewith in the name of J. K. Hastings, B. C. Beihoff, M. S. Baran, J. E. Hansen and M. A. Juds and assigned to the assignee of this application.

BACKGROUND OF THE INVENTION

This invention relates to current sensors for measuring current in a current carrying conductor. More particularly, this invention relates to a current sensor which may be installed in operating position around a current carrying conductor of any cross-sectional configuration, and is particularly well suited for such installation after the current carrying conductor is installed in place.

It is known to detect and measure the current flowing in a conductor by disposing the conductor through a current transformer to pick up the magnetic flux generated by the current in the conductor and with the appropriate circuitry and indicating instruments, relate that flux to a measurement of the current flowing in the conductor. Current transformers are generally large, heavy devices having the opening for receiving the conductor defined by a continuous wall, thereby necessitating that the conductor be fed through the current transformer opening. Current transformers do exist wherein the wall defining the opening for the conductor has a gate which may be opened to permit the conductor to be laid into the opening and the gate subsequently reclosed. However, such gates require precision construction and it is necessary to recalibrate the current transformer each time the gate is opened and reclosed. In many applications, such as in aircraft, the large size and heavy weight of current transformers renders them impractical and undesirable. The aforementioned disadvantages for installation of current transformers to conductors which are already in place further renders them impractical for use in aircraft.

Another disadvantage of current transformers is that the opening for the conductor is usually a specifically defined configuration for the particular conductor. Accordingly, a specific current transformer must be designed and configured for each cross-sectional shape of conductor to which it is to be applied.

SUMMARY OF THE INVENTION

This invention provides a current sensor for measuring current flow in a conductor which has a unique magnetic flux concentrator utilized with a magnetoresistive transducer in a small, light-weight housing which permits a ferrous strap to be removably attached to the flux concentrator for providing a magnetic loop around the conductor. The ferrous strap may be configured in numerous variations to accommodate any cross-sectional shape of the conductor and may be disassembled and reassembled to the flux concentrator to permit assembly or installation of the current sensor to an already installed conductor without disturbing the sensitivity of the current sensor. The attachment provisions for the ferrous strap are made accessible to a commmon side so as to expedite the installation of the sensor. The flux concentrator comprises a pair of pole pieces which are spaced to define a magnetic sensing region therebetween and a magnetic shunt connected to the pole pieces to extend across the magnetic sensing region so as to direct only a portion of the magnetic field across the space between the pole pieces. A magnetoresistive transducer is placed in the magnetic sensing region to sense the magnetic field intensity therein and is connected to electrical circuitry which provides a plurality of electrical signals for use with ancillary apparatus for providing an indication of the measured amount of current detected by the magnetoresistive transducer. A bias magnetic flux is also applied to the magnetoresistive transducer at right angles to the flux path in the flux concentrator to increase the sensitivity of the transducer.

These and other advantages of the current sensor of this invention will become more apparent in the following description and claims when read inconjunction with the accompanying drawings.

BRIEF DESCRIPTION OF THE DRAWINGS

FIG. 3 is a front elevational view of the current sensor as shown in FIG. 2 with a cover removed therefrom, taken generally along the line 3—3 in FIG. 2;

FIG. 4 is an isometric view of a molded insulating housing of the current sensor of this invention;

FIG. 5 is a cross-sectional view of a terminal assembly of the current sensor of this invention taken along the line 5—5 in FIG. 3, including a portion of the cover;

FIG. 6 is an isometric view of a mounting clamp and screw for the current sensor of this invention;

FIG. 7 is an isometric view of an alternate embodiment of the current sensor of this invention;

FIG. 8 is an isometric view of an alternate upper strap for the current sensor of FIG. 7;

FIG. 9 is a cross-sectional view of the right-hand support for the current sensor of FIG. 7 taken along line 9—9 in FIG. 7.

DESCRIPTION OF THE PREFERRED EMBODIMENTS

Figure 1:
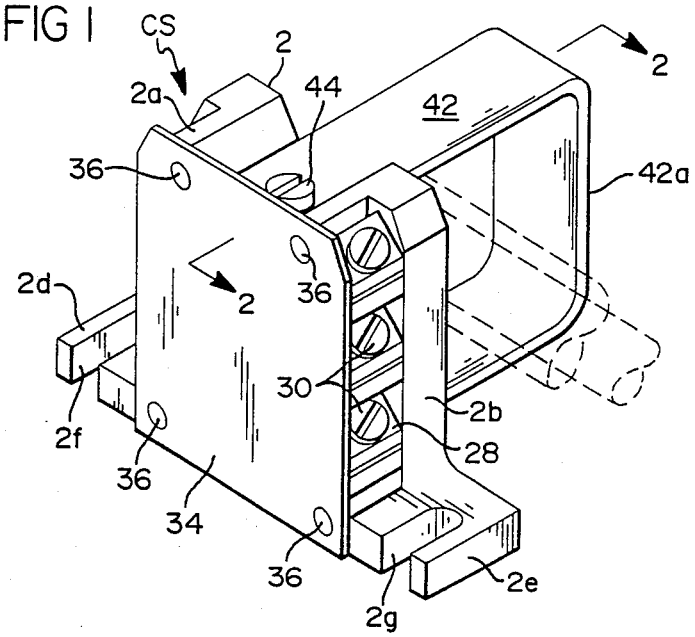
FIG. 1 is an isometric view of the current sensor of this invention.

The current sensor CS of this invention is contained within a light weight molded insulating housing 2. As best seen in FIG. 4, housing 2 comprises a pair of upright terminal support sections 2a and 2b which are formed in spaced apart, mirror image relation and joined by a central web 2c. Sections 2a and 2b have outwardly extending mounting feet 2d and 2e which cooperate with the lower edges of the sections 2a and 2b to form a mounting base for the housing 2. Mounting feet 2d and 2e have slots 2f and 2g therein open to the front side of the housing 2. The outer sides of each terminal support section 2a and 2b have a plurality of angularly disposed terminal support shelves 2h and 2m, respectively. The inner sides of terminal support sections 2a and 2b have vertically extending walls 2n and 2p which cooperate with the terminal support shelves 2h and 2m to form hollow interior cavities therebetween. The sections 2a and 2b are provided with pairs of holes 2q and 2r, respectively, which extend from the front side through to the rear side of the housing in the upper and lower portions thereof. Housing 2 is designed to be fabricated from a single cavity die having a parting plane parallel to the front and rear surfaces.

Figure 2:
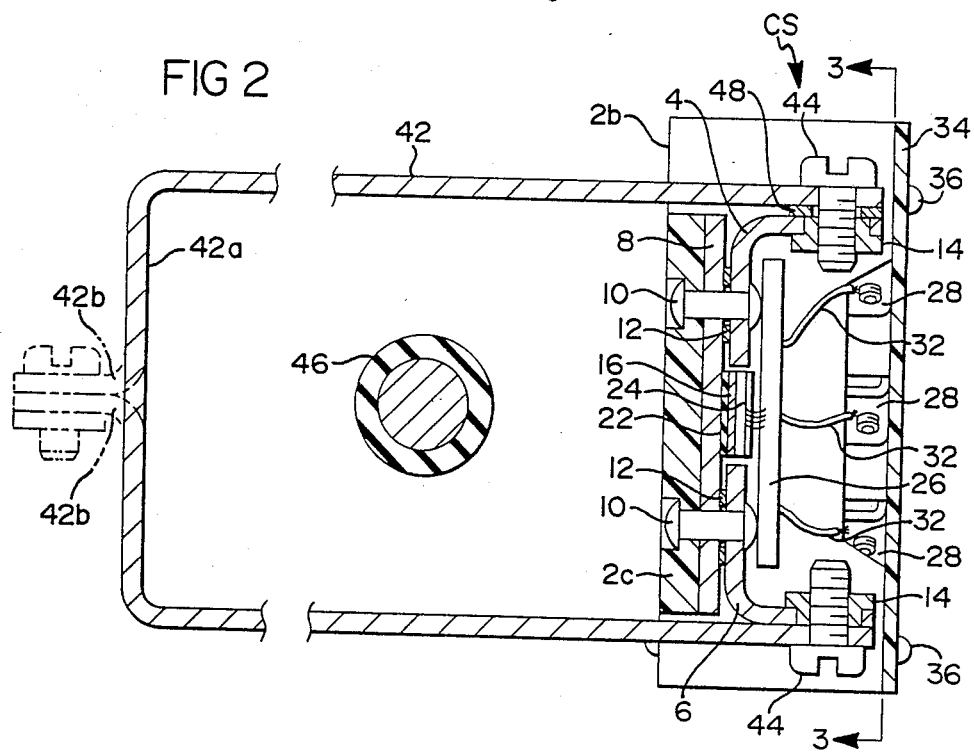
FIG. 2 is a cross-sectional view of the current sensor shown in FIG. 1 taken along the line 2—2 in FIG. 1.

A magnetic flux concentrator comprising a pair of L-shaped pole pieces 4 and 6 (see FIG. 2) and a magnetic shunt 8 is attached to the central web 2c by a pair of rivets 10 which extend through the respective pole pieces 4 and 6, magnetic shunt 8 and web 2c as shown in FIG. 2. A pair of brass or other nonmagnetic material washers 12 are disposed around rivets 10 between the respective pole pieces 4, 6 and the magnetic shunt 8 to provide a small magnetic gap approximately 0.016 inch between these members. The horizontal legs of the pole pieces 4 and 6 each have an opening therein which receives a pressed-in threaded nut 14, the horizontal legs and respective nuts thereby forming magnetic terminals for the current sensor CS, which terminals are disposed in the open area of housing 2 above and below central web 2c to be accessible to the exterior of the housing. The magnetic flux concentrator further comprises a biasing magnet structure disposed within the region between the opposite ends of the vertical legs of pole pieces 4 and 6. The biasing magnet structure comprises a strip of soft magnetic metal 16 having a pair of permanent magnets 18 and 20 affixed to its ends. This assembly is attached to the magnetic shunt 8 with a strip of nonmagnetic material such as a magnetic insulating material 22 interposed the shunt 8 and soft magnetic metal 16 by an adhesive or other suitable attaching means. Material 22 provides a small, approximately 0.016 inch magnetic gap between soft magnetic metal 16 and shunt 8. The permanent magnets 18 and 20 are horizontally or laterally spaced to provide a pocket therebetween into which a magnetoresistive transducer 24 is positioned. Transducer 24 is preferably that manufactured by North American Phillips Co. under part No. KMZ10C and may be positioned within the aforedescribed pocket by an adhesive, epoxy resin, or the like. Electrical leads from transducer 24 are connected to an electrical circuit board 26 which is positioned within the housing 2 in the area adjacent the magnetic flux concentrator and preferably retained in that position by a pool of epoxy resin (not shown).

Referring specifically to FIGS. 3 and 5, U-shaped metal wiring terminals 28 are disposed over each of the terminal support shelves 2h and 2m from the front side of the housing 2. The upper leg of each terminal 28 is provided with a clearance hole for a wiring screw 30 and the lower leg is provided with a tapped hole for that screw in alignment with the hole in the upper leg. As seen specifically in FIGS. 3, 4 and 5, the support shelves 2h and 2m are provided with a reduced thickness central section leaving a thin web along the upper, outer surface of the shelf. With the metal terminal 28 in place, the screw 30 is inserted within the opening of the upper leg of the terminal, forced through the thin web of the respective support shelf and is subsequently threaded into the opening in the lower leg of the terminal to provide a clamping structure for receiving an electrical termination thereto. A wire such as 32 from the circuit board 26 is attached to the lower leg of the respective terminals 28 by solder or the like to complete an electrical circuit from the circuit board to the respective terminals. Alternative methods of providing wire terminal connections from the circuit board 26 to the exterior of the device are contemplated, such as providing solder posts mounted on the terminal shelves 2h and 2m or by providing a pin type connector mounted either directly on the housing or at the ends of wires 32 leading from the circuit board 26 and brought exteriorly of the housing as a wiring harness.

A flat insulating cover 34 is disposed over the open front side of housing 2 and secured thereto by rivets 36 which pass through the respective holes 2q and 2r in the housing to retain the terminals 28 in place and close off the open front side of the housing. As seen in FIG. 6, a shallow U-shaped saddle 38 is provided for each of the mounting feet 2d and 2e. The short vertical legs of saddle 38 overlie the front and rear edges of the respective mounting feet 2d and 2e. A hole in the horizontal bight portion of saddle 38 positions a mounting screw 40 therein, the saddle preventing front-to-rear movement of the mounting screw and also cooperating with slot 2g to prevent lateral movement of the screw 40 and saddle 38.

In the embodiment shown in FIGS. 1 through 3, a U-shaped magnetizable member such as a ferrous strap 42 is removably attached to the magnetic terminals by screws 44 to provide a rectangular window at the rear of housing 2. As used herein, the term "ferrous" shall mean any material that is conductive of a magnetic flux. U-shaped strap 42 is horizontally oriented with its bight portion 42a vertically positioned to the rear of housing 2. Strap 42 may be positioned around a previously installed current carrying conductor 46 and subsequently attached to the magnetic terminals of the current sensor CS. Strap 42 may be of a selectively predetermined length which is dependent upon the cross-sectional shape of conductor 46 to accommodate a large variety of conductor shapes. In an alternative embodiment, strap 42 may be split into a two piece member wherein the bight portion 42a is separated and provided with horizontally extended flanges 42b as shown at the left in FIG. 2. The horizontal flange 42b of the lower portion of strap 42 may be provided ith a press-in nut such as nuts 14 and the horizontal flange 42b of the upper portion of strap 42 may be provided with a clearance hole for receiving a threaded fastener therethrough to clamp the two flanges together. Moreover, the upper portion of strap 42 may also be offset upwardly to increase the height of the window circumscribing the conductor 46, thereby accommodating a taller conductor 46. This embodiment would enable the current sensor housing 2 to be installed to a mounting panel with the lower portion of strap 42 disposed below the conductor 46 and the upper portion of strap 42 subsequently installed over the conductor 46. A nonmagnetic washer 48 is provided at the magnetic terminal of pole piece 4 for establishing a magnetic permeance gap on the order of 0.020 inch in the magnetic loop around conductor 46 to provide a precise method of controlling the total flux in the magnetic circuit which is detected by the strap 42 in response to current flow in conductor 46.

When the current sensor CS of this invention is installed around a conductor such as 46 as aforedescribed, the operation is as follows. Current flow in the conductor 46 generates a magnetic flux in proportion to the current flow which is picked up by the loop comprising strap 42 and the magnetic flux concentrator. The strength of the magnetic field intensity is dropped across the gap created by washer 48 at the magnetic terminal of pole piece 4. The magnetic field intensity is further divided between the pole pieces 4 and 6 and the shunt 8 by the spacing washers 12 disposed therebetween such that a majority of the magnetic field is received in the shunt 8, but a small portion thereof appears across the magnetic sensing region between the ends of the vertical legs of pole pieces 4 and 6. Transducer 24 senses the magnetic field intensity appearing in this sensing region and reacts through the circuit 26 to provide electrical signals at the output terminals which are in proportion to the magnetic field intensity sensed by the transducer 24.

FIGS. 7 through 9 show another alternative embodiment of the current sensor of this invention which may be used with conductors having significantly greater cross-sectional shape such that a support at the opposite end of the loop becomes desirable. Referring specifically to FIG. 7, the current sensor CS as aforedescribed is shown in isometric at the left-hand end of this view. The strap 42 has been replaced by separate upper and lower ferrous straps 50 and 52, respectively, each of these straps being a flat member of a selectable predetermined length. A housing 2' is provided at the right-hand ends of these straps 50 and 52. Housing 2' is identical to housing 2, but contains only a ferrous connector strap 54 therein. Strap 54 is C-shaped, the vertical leg of which is attached to the central web 2c' of housing 2' by rivets 10'. The horizontal upper and lower legs of strap 54 contain pressed-in nuts 14' within openings in the legs to provide upper and lower magnetic terminals for the housing 2'. A cover 34' is secured to the housing by rivets 36'. Straps 50 and 52 are attached to the upper and lower magnetic terminals of the housing 2' by screws 44'. This alternate construction of the loop portion provides support at the distant end of the loop when the current sensor CS is utilized in conjunction with a conductor having a significantly wide cross-sectional shape. It will be readily appreciated that the current sensor CS with a lower strap 52 attached thereto may be positioned adjacent the conductor and maneuvered to a position wherein the strap 52 may be attached to the lower magnetic terminal of the support housing 2' and the two housings 2 and 2' may then be installed to the mounting surface adjacent the conductor in which current is to be measured. The upper strap 50 may subsequently be attached to the magnetic terminals of housings 2 and 2' to complete the magnetic loop. An alternate embodiment upper strap 60 is shown in FIG. 8 which may be utilized for conductors which additionally have a significant vertical dimension as well as a width dimension. The strap 60 may be formed to have a selectable predetermined vertical offset between the ends which are to be attached to the magnetic terminals of the two housings.

Figure 10:
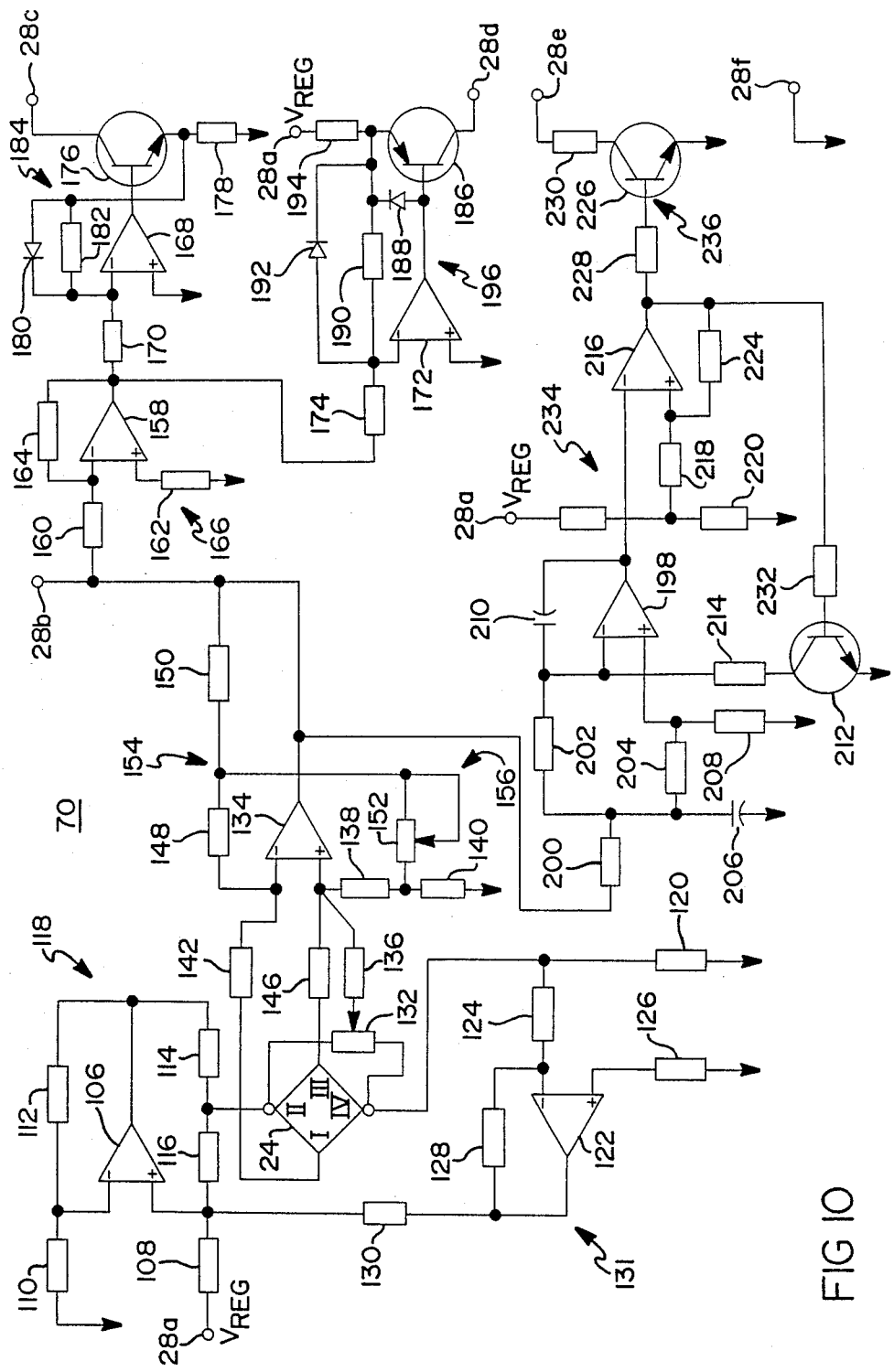
FIG. 10 is a diagrammatic view of an electrical circuit for the current sensor of this invention.

A control circuit 70 for the current sensor CS is shown in FIG. 10. Control 70 is formed on circuit board 26 with the exception of magnetoresistive transducer 24 which is suspended therefrom by its wire leads. Transducer 24 essentially is a resistive bridge which is normally balanced at zero magnetic field. In the presence of biasing magnets 18 and 20 the field becomes unbalanced and produces a differential voltage which is proportional to the amount of field that transducer 24 senses between pole pieces 4 and 6. As will be described hereinbelow, control circuit 70 will thus produce an output voltage which is proportional to the magnetic field and thus the current flow in conductor 46. Referring to FIG. 10, the elements of control circuit 70 are schematically illustrated which, as previously mentioned, are physically disposed on circuit board 26 within housing 2.

Control circuit 70 receives its power from a regulated voltage power supply at one of the terminals 28 such as terminal 28a provided by the host system incorporating sensor CS. Terminal 28a may be an upper terminal on section 2a of housing 2 and is interconnected to the +terminal of an op amp 106 through a 100K resistor 108. The −input of op amp 106 is connected to ground through a 100K resistor 110 and to the output terminal of op amp 106 through a 10K feedback resistor 112. The output of op amp 106 is interconnected with terminal II of transducer 24 through a 380 ohm resistor 114. The +input of op ammp 106 is also interconnected to terminal II of transducer 24 through a 1K resistor 116. Op amp 106 and resistors 108, 110, 112, 114 and 116 comprise a current source designated generally at 118 providing temperature compensation to the balance of circuit 70.

Terminal IV of transducer 24 is connected to ground through a 100K resistor 120 and to the −input terminal of an op amp 122 through a 120K resistor 124. The +terminal of op amp 122 is connected to ground through a 100K resistor 126. The output terminal of op amp 122 is interconnected to its −input terminal through a 540K feedback resistor 128 and to the +input terminal of op amp 106 through a 540K resistor 130. Op amp 122 and resistors 120, 124, 126, 128 and 130 provide additional temperature compensation and represent an option in control circuit 16. If such compensation is not required, those elements can be deleted and terminal IV of transducer 24 can be tied directly to ground as an alternative.

Terminals II and IV of transducer 24 are interconnected by the fixed resistor portion of a 50K potentiometer 132 acting as a voltage divider for providing zero field offset. The wiper of potentiometer 132 is interconnected to the +input terminal of an op amp 134 through a 247K resistor 136. The +input terminal of op amp 134 is also interconnected to ground through a series combination of two 128K resistors 138 and 140. Terminal I of transducer 24 is interconnected with the −input terminal of op amp 134 through a 10 K resistor 142 and terminal III of transducer 24 is interconnected with the −input terminal of op amp 134 through a 10K resistor 146. The output terminal of op amp 134 is directly connected to a user accessible terminal 28b providing an analog voltage level proportional to sensed current.

The output of op amp 134 is also interconnected to the −input thereof through a series combination of two 128K resistors 148 and 150. The point of common connection between resistors 148 and 150 is interconnected to the point of common connection between resistors 138 and 140 by the fixed resistance portion of a potentiometer 152. The point of common connection between resistors 148 and 150 is also directly connected to the wiper of potentiometer 152. Op amp 134 and resistors 142, 146, 148 and 150 comprise a T-type amplifier designated by arrow 154 and resistors 138 and 140 with potentiometer 152 comprises a temperature comensation circuit designated generally 156.

The output of op amp 134 is interconnected to the −input of an op amp 158 through a 10K resistor 160. The +input of op amp 158 is connected to ground through a 11K resistor 162. The output of op amp 158 is interconnected with the −input thereof through a 22K feedback resistor 164. Op amp 158 and resistors 160, 162 and 164 comprise an inverting amplifier designated generally at 166. The output of amplifier 166 is interconnected to the −input of op amp 168 through a 10K resistor 170 and to the −input of another op amp 172 through a second 10K resistor 174. The +input terminals of both op amps 168 and 172 are connected to ground. The output of op amp 168 is connected to the base of a type 2N2222 transistor 176. The collector of transistor 176 is connected to a user accessible terminal 28c providing a current sink signal proportional to sensed current for EMI and RFI rejection purposes. The emitter of transistor 176 is interconnected to ground through a 10 ohm current limiting resistor 178. The emitter of transistor 176 is also interconnected to the −input of op amp 168 through the parallel combination of a IN4148 diode 180 and a 10K resistor 182. Op amp 168 and its associated componentry constitutes a voltage controlled current sink circuit 184.

The output of op amp 172 is interconnected to the base of a type 2W2907 transistor 186 and interconnected with a −input thereof through a series combination of a type 1N4148 diode 188 and a parallel combination of a 10K resistor 190 and a type 1W4148 diode 192. A point of common connection between diode 188 and resistor 190 is connected to the emitter of transistor 186. The emitter of transistor 186 is also interconnected with the source of regulated voltage at terminal 28a through a 10 ohm current limiting resistor 194. Op amp 172 and its associated componentry function as a voltage controlled current source circuit designated generally 196 providing an output at the collector of transistor 186 to a user accessible terminal 28d a current source signal proportional to sensed current.

The output terminal of op amp 134 is interconnected to the −input of an op amp 198 through a series combination of a 5K resistor 200 and a 100K resistor 202. The point of common connection between resistors 200 and 202 is interconnected to the +input terminal of op amp 198 through a 51K resistor 204 and to ground through a 100 pico farad capacitor 206. The +input terminal of op amp 198 is connected to ground through a 51K resistor 208. The output of op amp 198 is interconnected to the −input thereof through a 0.1 micro farad capacitor 210. The −input terminal of op amp 198 is interconnected to the collector of a type 2N2222 transistor 212 through a 51K resistor 214. The emitter of transistor 212 is connected to ground. The output of op amp 198 is connected to the −input of another op amp 216. The +input terminal of op amp 216 is connected to ground through a series combination of a 50K resistor 218 and a 10K resistor 220. The point of common connection between resistors 218 and 220 is interconnected to the regulated voltage supply at terminal 28a through a 10K resistor 222. The output terminal of op amp 216 is interconnected to the +input terminal thereof through a 2.2 M resistor 224 and is interconnected to the base of a type 2N2222 transistor 226 through a 3.3K resistor 228. The collector of transistor 226 is connected to a user accessible terminal 28e through a 220 ohm current limiting resistor 230. The emitter of transistor 226 is connected to ground. Finally, a user accessible, or ground terminal 28f is provided as the upper terminal on section 26 of housing 2. The output terminal of op amp 216 is interconnected to the base of transistor 212 through a 5K resistor 232. Op amps 198 and 216 as well as their associated componentry comprise a voltage control oscillator designated generally at 234. VCO 234 provides a modulated square wave output to transistor 226 which, with its associated components comprise an output circuit 236 providing isolation to control circuit 70. The output at terminal 28e provides a frequency modulated signal proportional to sensed current.

Control circuit 70 thereby provides a plurality of user accessible outputs for extreme flexibility and application. For the specific circuit components cited hereinabove, a regulated voltage level in the range of 5 to 30 volts is contemplated.

The foregoing has described a current sensor for measuring current in a conductor which is capable of measuring a wide range of currents in a very precise manner, is light weight and physically small, has a magnetic loop for circumscribing the conductor which may be readily configured to circumscribe any cross-sectional shape of the conductor and which may be readily detached and reassembled to the current sensor without disturbing the sensitivity of the sensor. While the current sensor of this invention has been disclosed herein in several preferred embodiments, it is to be understood that it is susceptible of various modifications without departing from the scope of the appended claims.

We claim:

1. A current sensor quantitatively measuring current flow in an electrical conductor of any cross-sectional shape comprising:

an insulating housing;

a magnetic flux concentrator in said housing comprising a pair of magnetic pole pieces having respective flat surfaces in spaced parallel facing relation to provide a magnetic sensing region therebetween and a magnetic shunt connected to said pole pieces across said region, said pole pieces further comprising magnetic terminal means accessible exteriorly of said housing;

magnetizable means having a selectively predetermined configuration surrouding the cross-sectional shape of said electrical conductor in spaced relation thereto, said magnetizable means being removably attached to said magnetic terminal means establishing a magnetizable loop including said flux concentrator around said conductor providing a linear magnetic field in said magnetic sensing region having an intensity proportional to current flow in said conductor, said magnetizable means being oriented to locate said shunt between said conductor and said magnetic sensing region;

means in said housing including transducer means disposed between said flat surfaces responsive to said magnetic field intensity in said magnetic sensing region providing electric signals in proportion to said magnetic field intensity; and electric wiring terminal means for each electric signal externally disposed on said housing, said electric wiring terminal means connected to said means responsive to magnetic field intensity receiving said electric signals thereat.

2. The current sensor defined in claim 1 further comprising means at one of said magnetic terminals for providing a predetermined permeance gap between said magnetizable means and said one magnetic terminal.

3. The current sensor defined in claim 1 wherein said magnetizable means comprises a ferrous strap having its ends arranged for attachment to said magnetic terminals.

4. The current sensor defined in claim 1 wherein said magnetic shunt and said pole pieces are integrally attached to said housing and means are provided establishing a nonmagnetic spacing between said pole pieces and said shunt.

5. The current sensor defined in claim 1 wherein said magnetic terminal means comprise portions of said pole pieces disposed adjacent respective openings in said housing and fastener means removably attaching said magnetizable means in flux conducting relation to said pole piece portions.

6. The current sensor defined in claim 1 wherein said respective flat surfaces have a substantially greater lateral dimension than said transducer means, said flux concentrator further comprising a pair of laterally spaced permanent magnets disposed in said magnetic sensing region defining a pocket between said permanent magnets and between said flat surfaces, said transducer means being disposed in said pocket.

7. The current sensor defined in claim 6 wherein said permanent magnets provide a magnetic bias field in said magnetic sensing region at a right angle to a magnetic field directed between said pole pieces in said magnetic sensing region.

8. The current sensor defined in claim 7 wherein said means responsive to magnetic field intensity comprises magnetoresistive means disposed in said pocket oriented to sense magnetic field intensity between said pole pieces.

9. The current sensor defined in claim 1 wherein said magnetizable means comprises a pair of ferrous straps attached at first ends thereof to said magnetic terminals and means interconnecting opposite ends of said straps.

10. The current sensor defined in claim 9 further comprising threaded fastener means attaching said ferrous straps to said magnetic terminals and interconnecting opposite ends of said straps, said fastener means for respective first and opposite ends of one of said straps being oriented in the same direction to provide access thereto from a common side of said current sensor.

11. The current sensor defined in claim 9 wherein said means interconnecting opposite ends of said straps comprises a third ferrous strap, respective ends thereof attached to said opposite ends of said straps.

12. The current sensor defined in claim 11 further comprising threaded fastener means attaching said first ends of said straps to said magnetic terminals and securing said opposite ends to respective ends of said third strap, said threaded fastener means for respective first and opposite ends of one of said straps being oriented in the same direction provide access thereto from a common side of said current sensor.

13. The current sensor defined in claim 11 wherein said third strap is disposed within a second insulating housing, said ends of said third strap being accessible exteriorly of said second housing.

14. The current sensor defined in claim 13 wherein one of said pair of straps is offset away from the other of said pair of straps increasing the area circumscribed by said pair of straps and said insulating housings.

15. The current sensor defined in claim 14 wherein said pair of straps are replaced by alternate pairs of straps having predetermined varied lengths varying said area circumscribed by said pair of straps and said insulating housings.

16. A current sensor quantitatively measuring current flow in an electrical conductor of any cross-sectional shape comprising:
an insulating housing;
a plurality of externally accessible electrical wiring terminals supported in said housing;
a magnetic flux concentrator supported in said housing comprising a pair of separate pole pieces having respective flat surfaces in spaced parallel facing relation to provide a linear magnetic sensing region therebetween, portions of said pole pieces being adjacent openings in said housing, and magnetic shunt means juxtaposed said pole pieces across said magnetic sensing region;
means responsive to magnetic field intensity in said magnetic sensing region disposed in said housing comprising magnetoresistive transducer means disposed in said magnetic sensing region between said flat parallel surfaces and electric circuit means comprising a circuit board having wired connections to said terminals and said magnetoresistive transducer means; and
magnetizable means removably attached to said portions of said pole pieces adjacent said openings in said housing forming a magnetic loop including said flux concentrator around said electrical conductor, dimensions and configuration of said magnetizable means being determined by cross-sectional shape of said conductor, and said shunt being disposed between said conductor and said magnetic sensing region.

17. The current sensor defined in claim 16 wherein said magnetizable means is positioned around said conductor and subsequently attached to said portions of said pole pieces.

18. The current sensor defined in claim 17 further comprising means associated with one of said pole pieces at said portion thereof adjacent a respective one of said openings providing a predetermined permeance gap between said magnetizable means and said portion of said one of said pole pieces.

19. The current sensor defined in claim 17 wherein said magnetizable means comprises a unitary ferrous strap having its ends positioned for attachment to said portions of said pole pieces.

20. The current sensor defined in claim 17 wherein said magnetizable means comprises a pair of ferrous straps of lengths determined by the cross-sectional shape of said conductor, said straps connected at first ends thereof to said portions of said pole pieces, and means interconnecting opposite ends of said straps completing said magnetic loop.

21. The current sensor defined in claim 20 wherein said means interconnecting opposite ends of said straps comprises a third ferrous strap and fastener means securing said opposite ends to respective ends of said third strap.

22. The current sensor defined in claim 21 wherein said third strap is supported in a second insulating housing similar to said first mentioned insulating housing, said third strap having portions adjacent openings in said second housing for attachment of said opposite ends of said pair of straps to said portions of said third strap.

23. The current sensor defined in claim 22 wherein one of said pair of straps is offset away from the other of said pair of straps increasing the area circumscribed by said pair of straps and said first and second insulating housings.

* * * * *